United States Patent
Ward (10) Patent No.: US 9,557,358 B2
(45) Date of Patent: Jan. 31, 2017

(54) MINIMAL RECONFIGURATION SPECTRUM STITCHING WITH OVERLAPPED BANDS

(75) Inventor: Benjamin A. Ward, Portland, OR (US)

(73) Assignee: TEKTRONIX, INC., Beaverton, OR (US)

( * ) Notice: Subject to any disclaimer, the term of this patent is extended or adjusted under 35 U.S.C. 154(b) by 421 days.

(21) Appl. No.: 13/331,017

(22) Filed: Dec. 20, 2011

(65) Prior Publication Data

US 2012/0269252 A1 Oct. 25, 2012

Related U.S. Application Data (60) Provisional application No. 61/477,412, filed on Apr. 20, 2011.

(51) Int. Cl.

| | | |
|---|---|---|
| G01R 23/00 | (2006.01) | |
| G01R 23/163 | (2006.01) | |
| G06K 15/00 | (2006.01) | |
| H04B 17/00 | (2015.01) | |
| G06K 17/00 | (2006.01) | |

(52) U.S. Cl.
CPC .............. *G01R 23/163* (2013.01); *G06K 15/00* (2013.01); *G06K 17/00* (2013.01); *H04B 17/00* (2013.01)

(58) Field of Classification Search
CPC ........ G06K 15/00; G06K 17/00; G06K 19/00; H04B 17/00
USPC ...................................... 324/76.19
See application file for complete search history.

(56) References Cited

U.S. PATENT DOCUMENTS

| 3,711,784 A * | 1/1973 | Heise .................... H03B 19/00 |
| | | 331/49 |
| 5,986,482 A * | 11/1999 | Suzuki ........................ 327/99 |
| 6,064,662 A * | 5/2000 | Gitlin et al. ................. 370/330 |

(Continued)

FOREIGN PATENT DOCUMENTS

| DE | 102004047042 A1 | 6/2006 |
| WO | 2008050928 A1 | 5/2008 |
| WO | 2008072091 A2 | 6/2008 |

OTHER PUBLICATIONS

European Search Report, European Patent Application EP 12162742, filed Mar. 3, 2012, 7 pages, Jul. 27, 2012, European Patent Office, Berlin, Germany.

(Continued)

*Primary Examiner* — Jermele M Hollington
*Assistant Examiner* — Temilade Rhodes-Vivour
(74) *Attorney, Agent, or Firm* — Marger Johnson (57) ABSTRACT

Embodiments of this invention include a test and measurement instrument and associated methods for acquiring and stitching wide overlapped non-uniform frequency bands so that a user specified band can be efficiently displayed and analyzed. The test and measurement instrument includes a user interface to receive the user specified frequency span. Acquisition circuitry acquires one or more predefined frequency bands having non-uniform overlapping frequency ranges. A frequency band processing section can decimate the acquired frequency bands, mask the acquired frequency bands, and stitch the masked frequency bands together. A display section displays the user specified frequency span using the stitched frequency bands. Due to the overlap configuration of the wide non-uniform bands, any user specified span between 50 kHz and 6 GHz, or thereabout, can be covered by two bands.

22 Claims, 5 Drawing Sheets

(56) References Cited

U.S. PATENT DOCUMENTS

| | | | |
|---|---|---|---|
| 6,094,229 A * | 7/2000 | Ohshima | 348/555 |
| 6,122,537 A * | 9/2000 | Schmidt | 600/407 |
| 6,195,400 B1 * | 2/2001 | Maeda | 375/327 |
| 6,275,990 B1 * | 8/2001 | Dapper | G06F 17/14 348/E7.07 |
| 7,184,961 B2 * | 2/2007 | Sato | G10L 19/0208 341/50 |
| 7,659,708 B2 * | 2/2010 | Payne, IV | 324/76.23 |
| 7,746,052 B2 * | 6/2010 | Noujeim | 324/76.19 |
| 8,112,238 B1 * | 2/2012 | Gorin | 702/107 |
| 2002/0145490 A1 * | 10/2002 | Sauder et al. | 333/202 |
| 2003/0008628 A1 * | 1/2003 | Lindell et al. | 455/180.1 |
| 2004/0145410 A1 * | 7/2004 | Selz | H03H 7/0161 330/107 |
| 2006/0111074 A1 * | 5/2006 | Petilli | H04B 1/001 455/334 |
| 2007/0110198 A1 | 5/2007 | Skarby et al. | |
| 2007/0238428 A1 * | 10/2007 | Fisher | 455/205 |
| 2007/0250558 A1 | 10/2007 | Feldhaus et al. | |
| 2009/0002213 A1 | 1/2009 | LaMarche et al. | |
| 2009/0045798 A1 | 2/2009 | Heah et al. | |
| 2009/0092177 A1 * | 4/2009 | Dvorak et al. | 375/224 |
| 2010/0220778 A1 | 9/2010 | Fuse et al. | |
| 2010/0328546 A1 * | 12/2010 | Rafi | H03J 3/06 348/731 |

OTHER PUBLICATIONS

Anonymous, "Fundamentals of Real-Time Spectrum Analysis," Tektronix, Beaverton, Oregon, (c) 2009, pp. 1-52, retrieved from internet on Jan. 16, 2013, www.tektronix.com/rsa.
Second Office Action for Chinese Patent Application No. 201210117348.X, dated Apr. 11, 2016, 16 pages.

* cited by examiner

MINIMAL RECONFIGURATION SPECTRUM STITCHING WITH OVERLAPPED BANDS

RELATED APPLICATION DATA

This application claims the benefit of U.S. Provisional Application No. 61/477,412, filed on Apr. 20, 2011, which is hereby incorporated by reference.

BACKGROUND

Spectrum analyzers have an upper limit to how wide a frequency span can be acquired and processed at one time. Such upper limit is caused by speed and processing limitations of the hardware, and is particularly applicable to digital spectrum analyzers, where a band of signal is acquired and transformed into a frequency spectrum for that band. When a frequency span that is wider than can be accommodated in one acquisition is desired, multiple acquisitions with different acquisition and processing settings must be processed and the resulting two or more partial spectrums are subsequently "stitched" together.

Figure 1:
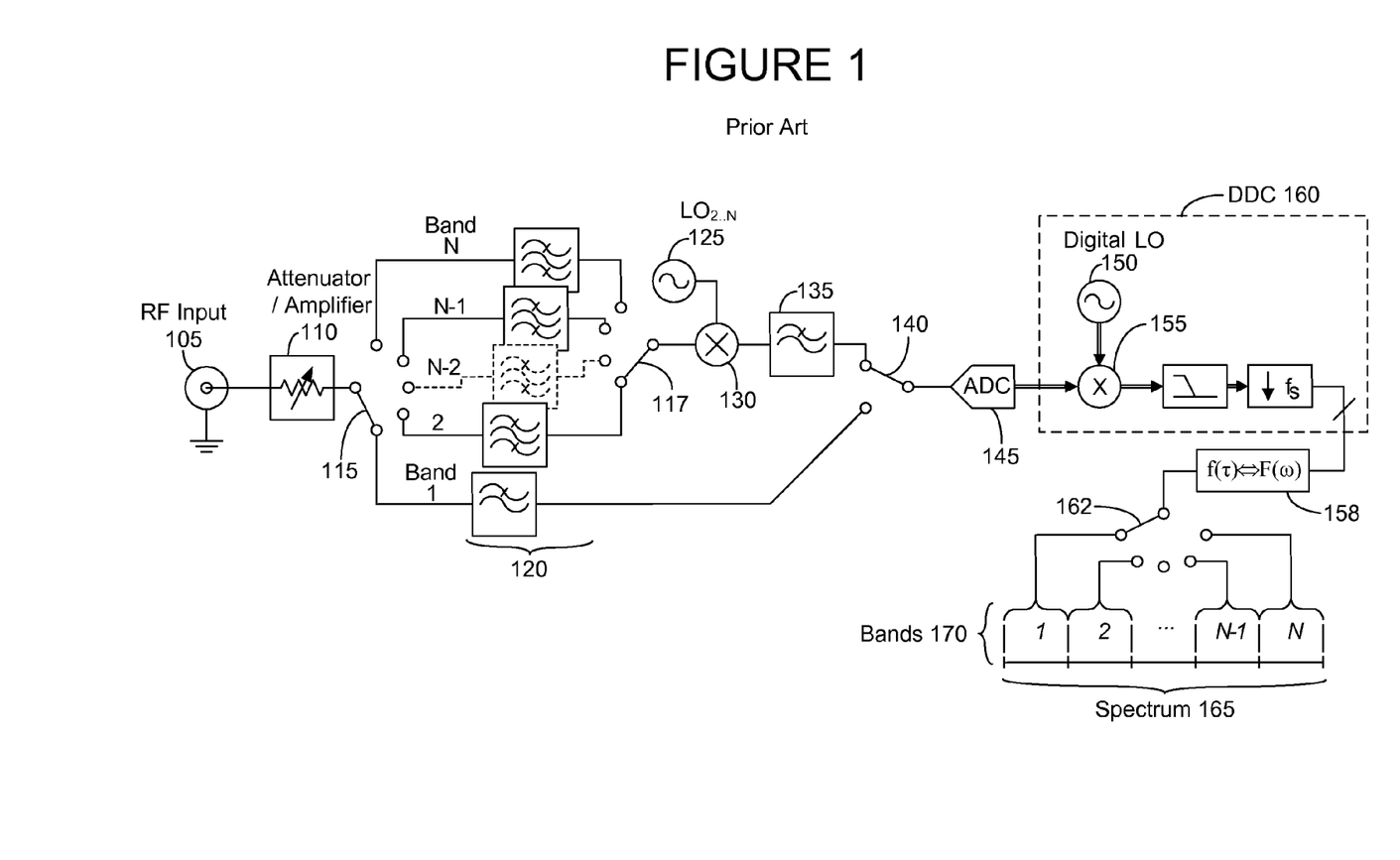
FIG. 1 illustrates a conventional approach for multiple acquisitions and stitching of uniform frequency bands to provide a full spectrum.

FIG. 1 illustrates a conventional approach for multiple acquisitions and stitching of uniform frequency bands to provide a full spectrum. An RF input 105 receives a signal, which is attenuated or amplified using attenuator/amplifier 110. The signal is directed to different paths using switch 115. The paths correspond to different frequency bands 1 through N. Filters 120 are associated with the paths. All bands are of the same width, or at least substantially the same width. In other words, the frequency ranges for each path are uniform in their width with respect to each other. This is shown in the bands 170 that are output as spectrum 165. From 2 to N bands are stitched to create the wide span spectrum 165. Although the bands 170 are shown abutting one another, some overlap is necessary. In the conventional art, the overlap is minimal, on the order of 1%.

Bands 2 through N are sent to the mixer 130 using switch 117. The mixer 130 mixes the bands 2 through N with a local oscillator signal 125. Low pass filter 135 removes local oscillator feed-through and image spectrums that result from the mixing process. The analog-to-digital converter (ADC) 145 receives bands 1 through N from switch 140, and digitizes them. After the ADC, the signal may be further conditioned by a digital down converter (DDC) section 160, which may adjust the center frequency and reduce the sample rate. The DDC section 160 also includes a digital mixer 155 to mix the bands with a digital local oscillator signal 150 for each band, as well as other components for decimating or down sampling each individual band.

The bands are then transformed using transform 158, which can be a Fourier transform, among other suitable transform operations. The different spectrum bands are stitched together and the switch 162 outputs the bands 170 as spectrum 165. The switch 162 can be a virtual switch, implemented in software. Multiple stitches require multiple acquisitions. Each additional stitch requires a corresponding additional acquisition.

For performance and quality reasons, it would be desirable to minimize the number of stitches. With very wide overlapping bands, the bands can be mixed and matched to minimize the number of acquisitions, and therefore, stitching can be made less frequent. It would also be desirable to have non-uniform frequency ranges associated with each band, so that a user specified span is more likely to fall within one or more of the non-uniformly configured bands. It would be desirable to optimize downstream processing of each band by processing each band as if the full band was present.

DETAILED DESCRIPTION

Figure 2A:
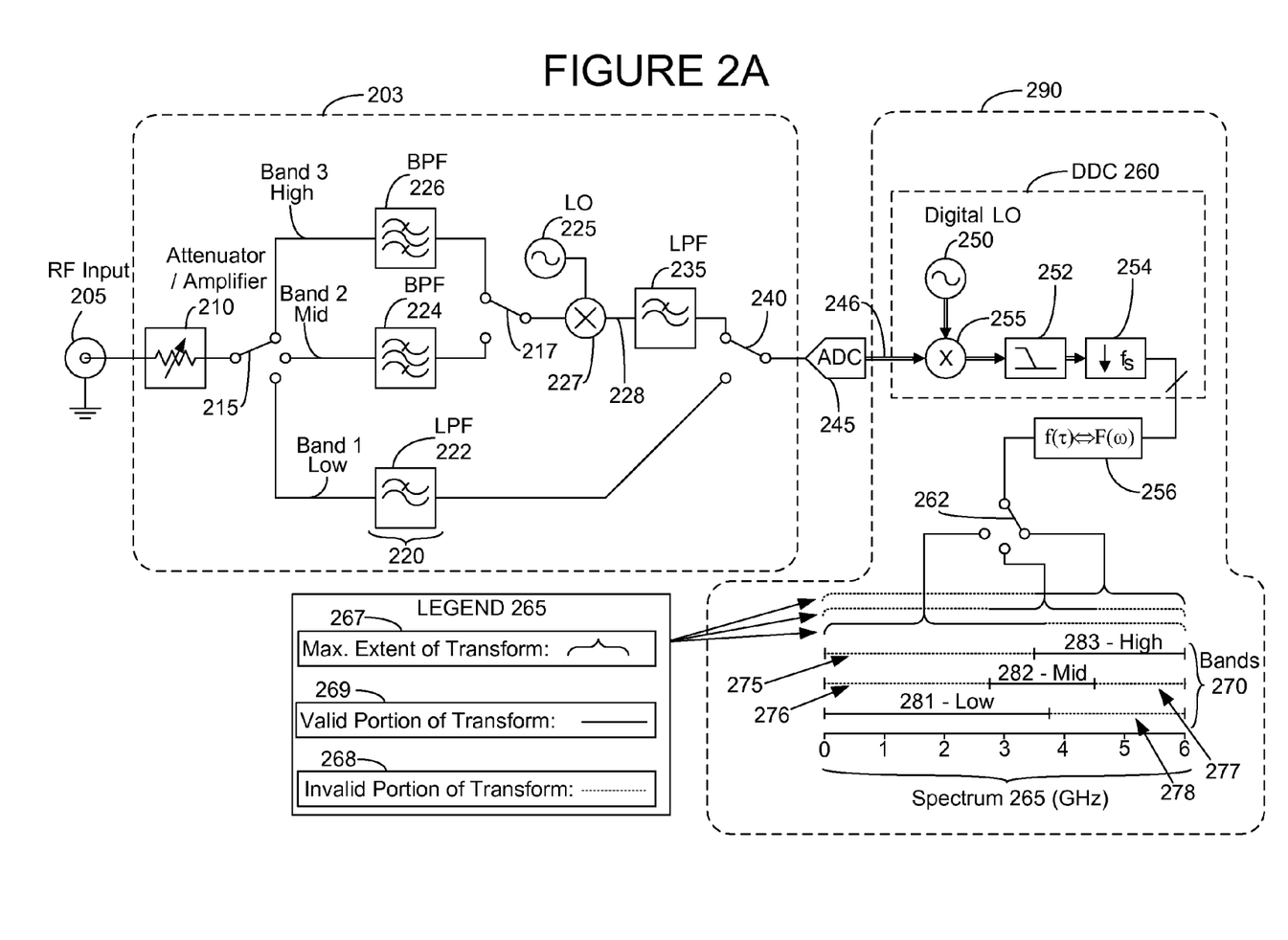
FIG. 2A illustrates a block diagram of components of a test and measurement instrument including acquisition circuitry and a frequency band processing section according to an example embodiment of the invention.
Figure 2B:
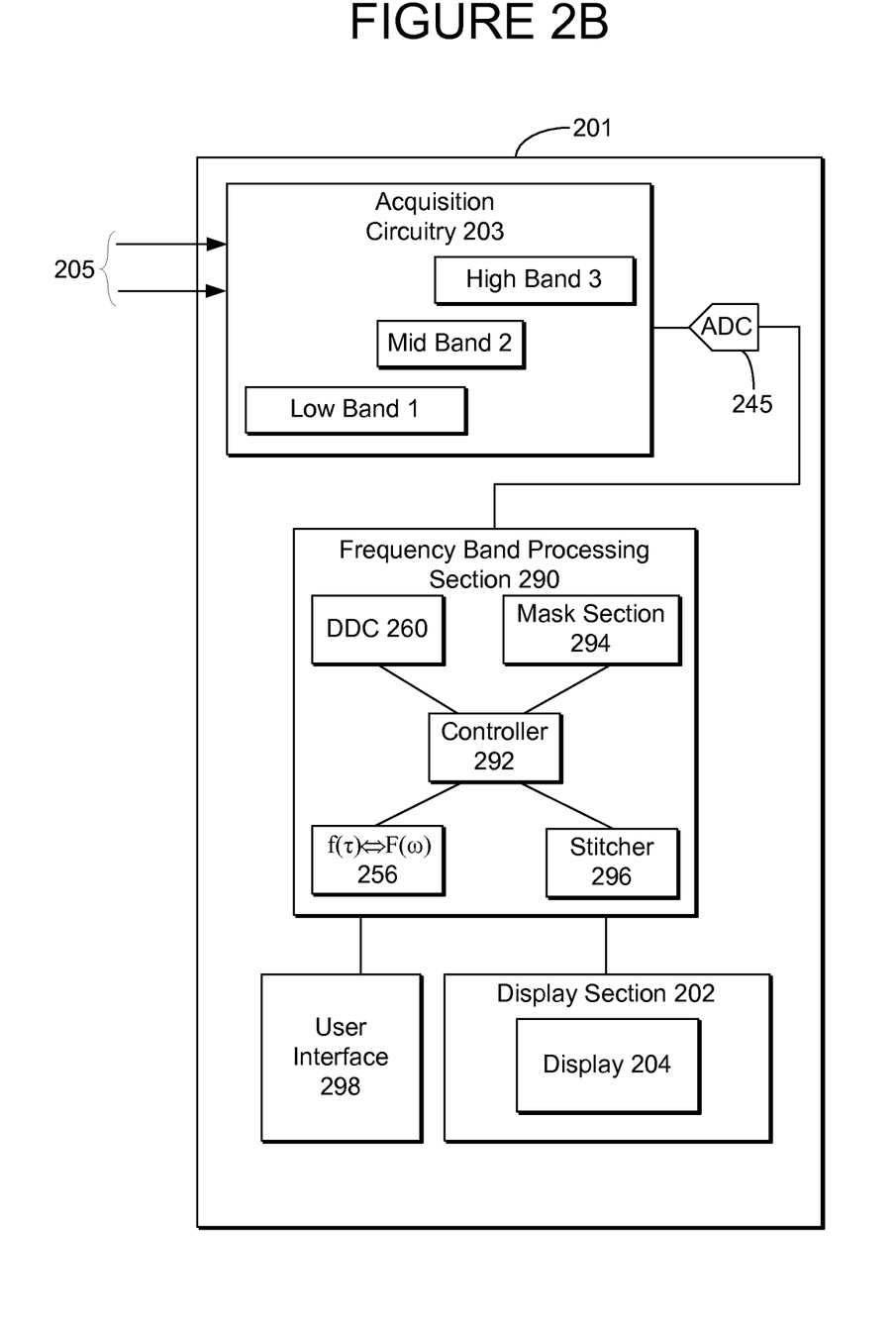
FIG. 2B illustrates a block diagram of a test and measurement instrument including the components of FIG. 2A.

FIG. 2A illustrates a block diagram of components of a test and measurement instrument including an RF front end 203 portion of acquisition circuitry, one or more analog-to-digital converters (ADCs) 245, and a frequency band processing section 290 according to an example embodiment of the invention. FIG. 2B illustrates a block diagram of a test and measurement instrument 201 including the components of FIG. 2A. Reference is now made to FIGS. 2A and 2B.

The test and measurement instrument 201 is preferably a spectrum analyzer or mixed domain oscilloscope (MDO), although it will be understood that the embodiments of the invention are not limited to only these types of instruments. For example, the embodiments described herein can be incorporated in or otherwise associated with other suitable test and measurement devices. For the sake of clarity and consistency, but not limitation, the test and measurement instrument 201 will generally be referred to herein as a spectrum analyzer.

The spectrum analyzer 201 can have one or more channels or RF inputs 205. While certain components of the spectrum analyzer 201 are shown to be directly coupled to each other, it should be understood that the spectrum analyzer can include a variety of other circuit or software components, inputs, outputs, and/or interfaces, which are not necessarily shown, but that can be disposed between or otherwise associated with the illustrated components of the spectrum analyzer 201. It will be understood that the spectrum analyzer 201 and any of its components described herein can be implemented by hardware, software, and/or firmware, or any combination thereof.

The spectrum analyzer 201 can include the RF front end signal conditioning portion 203 for acquiring and processing one or more RF input signals. The one or more RF input signals can include one or more electrical input signals under test. The signal conditioning circuitry 203 can include an attenuator and/or amplifier 210 coupled to the one or more RF input terminals 205 to receive the one or more input signals under test. While component 210 can be a combined attenuator/amplifier, for the sake of simplicity of reference, this component will be referred to herein for the remainder as simply an attenuator. A low band filtered path (e.g., Band 1), a mid band filtered path (e.g., Band 2), and a high band filtered path (e.g., Band 3) are capable of being coupled to the attenuator 210 through switch 215. The switch 215 is coupled to the attenuator 210 and is structured to divert the one or more input signals to at least one of the low band, mid band, and high band filtered paths, thereby producing a low frequency band, a mid frequency band, and a high frequency band, respectively.

The low frequency band, the mid frequency band, and the high frequency band are of non-uniform overlapping frequency ranges, which can be predefined or otherwise pre-programmed to have particular frequency ranges and/or overlapping structures or characteristics. Filters 220 can be used to filter the signals for different paths, thereby creating different bands having different extents. For example, the low frequency path can be filtered using low pass filter 222 so that the low frequency band includes a frequency range from 50 kHz, or thereabout, to 3.8 GHz, or thereabout. The mid frequency path can be filtered using a band pass filter 224 so that the mid frequency band includes a frequency range from 2.75 GHz, or thereabout, to 4.5 GHz, or thereabout. The high frequency path can be filtered using a band pass filter 226 so that the high frequency band includes a frequency range from 3.5 GHz, or thereabout, to 6 GHz, or thereabout. It will be understood that filters with different frequency ranges can be used. While three bands are illustrated and described herein, it will be understood that two or more non-uniform overlapping bands can be used. It will be understood that while the overlapping bands are illustrated as having non-uniform sizes, in some embodiments, the overlapping bands can have uniform sizes, without departing from the inventive concepts disclosed herein.

Each of the low frequency band, the mid frequency band, and the high frequency band correspond to a portion of a full frequency span. In other words, if the full frequency span is 6 GHz or thereabout, then the low frequency band represents a lower portion of the full frequency span, the mid frequency band represents a middle portion of the full frequency span, and the high frequency band represents a higher portion of the full frequency span. The low, mid, and high frequency bands may have considerable overlap, as set forth by example above. The larger overlap reduces the amount of stitching, even to a single stitch in some instances, as further described below. It will be understood that while these stated ranges are preferred ranges, different overlapping ranges can be used, having the same or different proportions and/or degree of non-uniformity. It will also be understood that while larger overlaps are preferable, the inventive concepts herein apply even where the overlap of the different ranges are smaller.

The output of the filter 226 and the filter 224 can be fed to mixer 227 via switch 217. The mixer can mix a local oscillator signal 225 with one or more of the filtered signals to produce a mixed signal 228. The mixed signal 228 can be further filtered using low pass filter 235. The low pass filter 235 can operate or otherwise filter, for example, at 3 GHz or thereabout. Switch 240 can select between the output of the low pass filter 222 and the output of the low pass filter 235.

The one or more analog-to-digital converters (ADC) 245 can digitize the signal received from the switch 240, and output a digitized signal 246.

A frequency band processing section 290 can include a digital down converter (DDC) section 260, a transform section 256, a mask section 294, a stitcher 296, and a controller 292, as shown in FIGS. 2A and 2B. The DDC section 260 receives the digitized signal 246, mixes the digitized signal 246 with a digital local oscillator signal 250 for each band using digital mixer 255, decimates the digitally mixed signal using filter 252, and down samples the signal using down sampler 254. The digital local oscillator signal 250 has a different frequency for each band. The input signal can be decimated using filter 252 and down sampler 254, the decimating procedures of which can be identical for each band. As a matter of implementation, filtering and decimating may be intertwined, or in other words, implemented as a Polyphase filter. The DDC section 260 may adjust the center frequency of the signal and/or may further condition the signal for the transform section 256. The transform section 256 can apply an identical transform function for each band. The transform section 256, the filter 252, and the down sampler 254 need not be reconfigured for each stitch, or in other words, these components have the same configuration for all stitches, as further described below.

More specifically, the digital mixer 255 can mix the digital local oscillator signal 250 with the low frequency band (e.g., Band 1) according to that band. The digital mixing can be table driven or by other suitable digital mixing techniques. The filter 252 and the down sampler 254 can decimate and down sample an intermediate frequency span, which is larger than or equal to a user-specified frequency span but not necessarily as large as the full frequency span, and includes the portion corresponding to the low frequency band. For a user specified spectrum range that requires the use of, and/or associated processing of more than one band, the intermediate frequency span can include a combination of bands, such as Low+Mid, Low+High, Low+Mid+High, or Mid+High. The final "stitched" spectrum can include all, or portions of, the intermediate frequency span. Only the Low+Mid+High configuration uses all three bands.

In other words, the filter 252 and the down sampler 254 can decimate and down sample the low frequency band as if the entire intermediate frequency span was present. The transform section 256 can receive the signal from the DDC section 260, including the decimated and down-sampled low frequency band, and transform the intermediate frequency span including the portion corresponding to the low frequency band. In other words, the transform section 256 can transform the low frequency band as if the entire intermediate frequency span was present. The transform section 256 can perform a Fourier transform operation or any other suitable transform operation.

Similarly, the digital mixer 255 can mix the digital local oscillator signal 250 with the mid frequency band (e.g., Band 2) according to that band. The filter 252 and the down sampler 254 can decimate and down sample an intermediate frequency span, which is larger than or equal to a user-specified frequency span but not necessarily as large as the full frequency span, and includes the portion corresponding to the mid frequency band. As mentioned above, for a user specified spectrum range that requires the use of, and/or associated processing of more than one band, the intermediate frequency span can include a combination of two or more bands, such as Low+Mid, Low+High, Low+Mid+

High, or Mid+High. The final "stitched" spectrum can include all, or portions of, the intermediate frequency span.

In other words, the filter 252 and the down sampler 254 can decimate and down sample the mid frequency band as if the entire intermediate frequency span was present. The transform section 256 can receive the signal from the DDC section 260, including the decimated and down-sampled mid frequency band, and transform the intermediate frequency span including the portion corresponding to the mid frequency band. In other words, the transform section 256 can transform the mid frequency band as if the entire intermediate frequency span was present.

In addition, the digital mixer 255 can mix the digital local oscillator signal 250 with the high frequency band (e.g., Band 3) according to that band. The filter 252 and the down sampler 254 can decimate and down sample an intermediate frequency span, which is larger than or equal to a user-specified frequency span but not necessarily as large as the full frequency span, and includes the portion corresponding to the high frequency band. As mentioned above, for a user specified spectrum range that requires the use of, and/or associated processing of more than one band, the intermediate frequency span can include a combination of bands, such as Low+Mid, Low+High, Low+Mid+High, or Mid+High. The final "stitched" spectrum can include all, or portions of, the intermediate frequency span.

In other words, the filter 252 and the down sampler 254 can decimate and down sample the high frequency band as if the entire intermediate frequency span was present. The transform section 256 can receive the signal from the DDC section 260, including the decimated and down-sampled high frequency band, and transform the intermediate frequency span including the portion corresponding to the high frequency band. In other words, the transform section 256 can transform the high frequency band as if the entire intermediate frequency span was present.

In this manner, the number of configuration changes is minimized. Irrespective of the non-uniformity of the various bands, each of the bands can be handled and processed using the same or similar configuration settings as the others. In other words, the DDC decimation and the configuration of the transform section are based on the full span of the final spectrum. Because the DDC section 260 and the transform section 256 are configured to operate on the full span, one or more portions of the spectrum produced for each band fall outside its band frequencies, and can therefore be "masked" off, and the remaining valid portions of the bands subsequently stitched together, as further described below. This simplifies the configuration process and minimizes changes between stitched acquisitions. This also reduces the number of processing structures required, the amount of memory and other hardware, and reduces the amount of switching from one mode to another. This simplification does away with what would otherwise be a need to optimize for each non-uniformly sized band.

Masking off (i.e., to 0) unwanted spectrum then adding together the different masked spectral segments is one approach to accomplish the final steps of stitching. But it will be understood that there are other ways of implementing the same or similar process. For example, a final stitched spectrum can be created by selectively copying from component spectrums, i.e., from the low, mid, and or high frequency spans. The term "mask" or "masking" as referred to herein means either the actual masking off of the spectrum portions, or alternatively, means selectively copying from component spectrums, and therefore, such terms should be construed broadly. Masking is individual to each band.

The transform section 256 can output the bands 270 via switch 262. It will be understood that the switch 262 can be a virtual switch, implemented in software. The low band 281 of the bands 270 is associated with the low band filtered path, i.e., Band 1. The mid band 282 of the bands 270 is associated with the mid band filtered path, i.e., Band 2. The high band 283 of the bands 270 is associated with the high band filtered path, i.e., Band 3. As indicated by the legend 265, the DDC section 260 and the transform section 256 produce various bands 270, portions of which correspond to valid transforms. The maximum extent of the transform 267, or in other words, the full extent of each band is indicated by solid and broken lines. The valid portions 269 of the transform are indicated by only the solid lines. The invalid portions 268 of the transform are indicated by only the broken lines. The switches 215, 217, 240, and 262 can be controlled so that each band is transmitted along their associated path at appropriate times.

It will be understood that the overall configuration of the frequency band processing section 290 can be based on the selected start and stop frequencies of a user-specified frequency span. For example, the spectral diagram associated with section 290 can have a start frequency of 50 kHz and a stop frequency of 6 GHz or have a start frequency of 2 GHz and a stop frequency of 5 GHz.

The mask section 294 can mask one or more portions of each band. More specifically, the mask section 294 can mask a portion 278 of the intermediate frequency span so that the portion 281 of the intermediate frequency span corresponding to the low frequency band (e.g., Band 1) is configured to be valid and is kept, and the masked portion 278 is discarded.

Similarly, the mask section 294 can mask portions 276 and 277 of the intermediate frequency span so that the portion 282 of the intermediate frequency span corresponding to the mid frequency band (e.g., Band 2) is configured to be valid and is kept, and the masked portions 276 and 277 are discarded.

Further, the mask section 294 can mask a portion 275 of the intermediate frequency span so that the portion 283 of the intermediate frequency span corresponding to the high frequency band (e.g., Band 3) is configured to be valid and is kept, and the masked portion 275 is discarded.

After masking the unwanted portions of each band, two or more bands can be combined, which can be referred to as "stitching" or "splicing." The stitching of the masked off bands can result in the final stitched spectrum 265. In other words, the stitcher 296 can stitch at least one of the low, mid, and high frequency bands with at least another one of the low, mid, and high frequency bands to form the full and final spectrum 265.

A user interface 298 is coupled to the frequency band processing section 290. The user interface can receive a user specified frequency span from a user. In other words, the user can select a particular frequency span of interest. The user specified frequency span may fall entirely within a single band (e.g., entirely within one of Band 1, Band 2, or Band 3). In such instances, stitching need not be performed. Alternatively, the user specified frequency span may bridge two or more overlapping bands. In the example used thus far, due to the overlap configuration of the wide non-uniform bands, any user specified span between 50 kHz and 6 GHz, or thereabout, can be covered by two bands. It will be understood that the full frequency span of 6 GHz can evolve and increase over time as hardware performance and capacity increases, and therefore, the ranges discussed herein are exemplary and not limiting to the inventive concepts disclosed.

After the user specified band is received by the spectrum analyzer, and it is determined that the user specified band lower and upper limits (i.e., start and stop frequency) don't fall wholly within any single predefined band, then the stitcher can go into stitching mode and stitch two or more of the low, mid, or high frequency bands together so that the entire user specified band can be displayed at one time on the display 204 using the display section 202. If the user specified band falls entirely within a single predefined band, then the other bands need not be acquired, nor do any of the bands need to be stitched together, because the user specified band can be displayed at one time based on a single predefined and acquired band. It will be understood that in some embodiments, however, it might still be desirable to acquire and stitch the other bands if greater precision is needed or in anticipation of different user specified bands.

Figure 3:
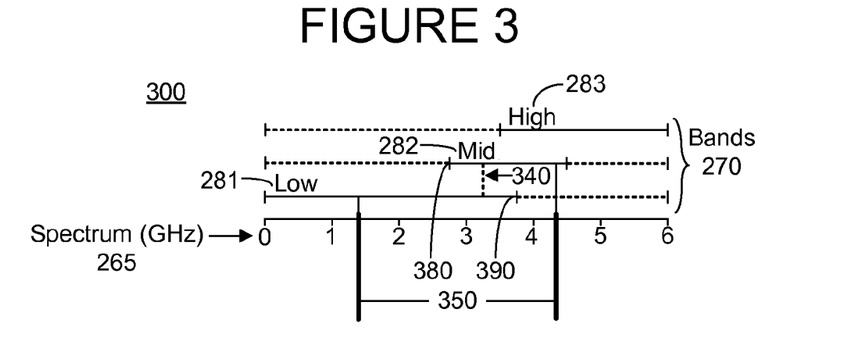
FIG. 3 illustrates a diagram of non-uniform overlapping frequency bands relative to a user specified frequency span according to another example embodiment of the invention.

FIG. 3 illustrates a diagram 300 of non-uniform overlapping frequency bands 270 relative to a user specified frequency span 350 according to another example embodiment of the invention. In this example, the user specified frequency span 350 includes a frequency range from about 1.4 GHz to about 4.3 GHz. As shown in FIG. 3, the user specified frequency span 350 bridges portions of the low band 281, the mid band 282, and the high band 283. Here, the low band 281 and the mid band 282 can form the intermediate span, and can be stitched together to provide the necessary frequency span to satisfy the user specified frequency span 350. By way of another example, the high band 283 can be acquired and stitched in as well to provide greater precision and/or to produce the full and final spectrum 265. The intermediate span and/or stitched band combinations can include Low+Mid, Low+High, or Low+Mid+High.

To accomplish the stitching between bands, a half-way point (e.g., 340) between boundaries (e.g., 380 and 390) of two different bands can be selected as the location in which the two different bands are stitched. It will be understood that alternative locations, such as where there are better signal to noise characteristics or a better noise floor, can be used as the point at which two different bands are stitched together. When the user specified span 350 falls entirely within the low frequency band 281 and the mid frequency band 282, then the user specified frequency span 350 can be displayed on the display 204 of the display section 202 (of FIG. 2A) using the stitched frequency bands 281 and 282.

Figure 4:
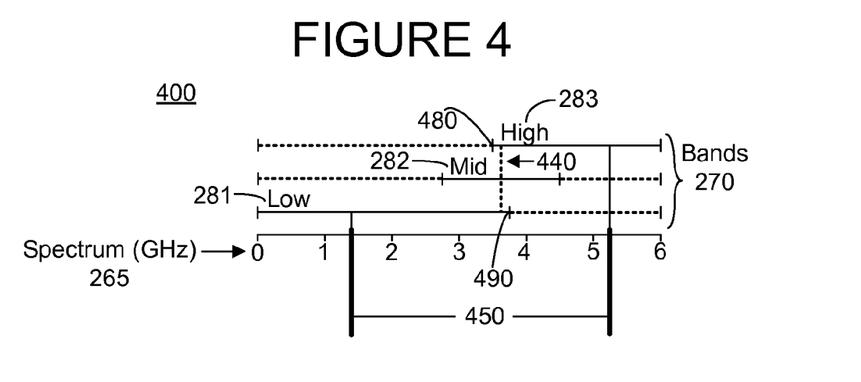
FIG. 4 illustrates a diagram of non-uniform overlapping frequency bands relative to a user specified frequency span according to yet another example embodiment of the invention.

FIG. 4 illustrates a diagram 400 of non-uniform overlapping frequency bands relative to a user specified frequency span 450 according to yet another example embodiment of the invention. In this example, the user specified frequency span 450 includes a frequency range from about 1.4 GHz to about 5.2 GHz. As shown in FIG. 4, the user specified frequency span 450 bridges portions of the low band 281, the mid band 282, and the high band 283. The low band 281 and the high band 283 can be stitched together to provide the necessary frequency span to satisfy the user specified frequency span 450. In this example, the mid band 282 need not be used, although in some embodiments, it might be preferable to acquire and stitch in the mid band 282 as well to provide greater precision. The intermediate and/or stitched band combinations can include Low+Mid, Low+High, or Low+Mid+High.

To accomplish the stitching between bands, a half-way point (e.g., 440) between boundaries (e.g., 480 and 490) of two different bands can be selected as the location in which the two different bands are stitched. It will be understood that alternative criteria, such as where there are better signal to noise characteristics or a better noise floor, can be used to select the stitching location at which two different bands are stitched together. When the user specified span 450 falls entirely within the low frequency band 281 and the high frequency band 283, then the user specified frequency span 450 can be displayed on the display 204 of the display section 202 (of FIG. 2A) using the stitched frequency bands 281 and 283.

Figure 5:
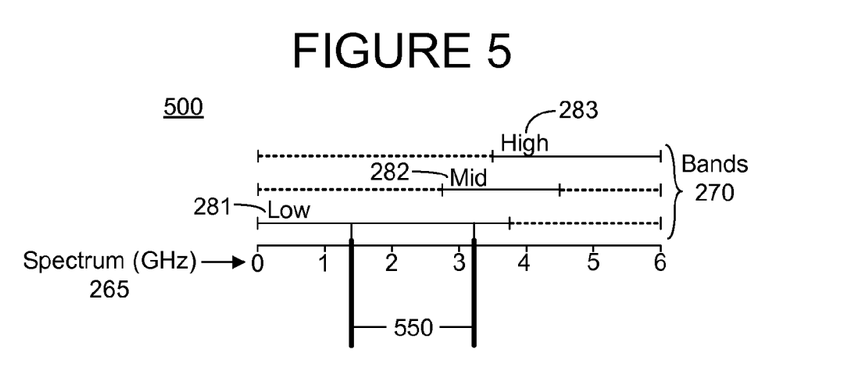
FIG. 5 illustrates a diagram of non-uniform overlapping frequency bands relative to a user specified frequency span according to still another example embodiment of the invention.

FIG. 5 illustrates a diagram 500 of non-uniform overlapping frequency bands 270 relative to a user specified frequency span 550 according to still another example embodiment of the invention. In this example, the user specified frequency span 550 includes a frequency range from about 1.4 GHz to about 3.2 GHz. As shown in FIG. 5, the user specified frequency span 550 falls entirely within the low band 281. The low band 281 provides the necessary frequency span to satisfy the entire user specified frequency span 550.

When the user specified span 550 falls entirely within the low frequency band 281, then the user specified frequency span 550 can be displayed on the display 204 of the display section 202 (of FIG. 2A) using only the low frequency band 281. In this example, the mid band 282 and the high band 283 need not be used, although in some embodiments, it might be preferable to acquire and stitch in the mid band 282 and/or the high band 283 as well to provide greater precision and/or to complete the full and final spectrum 265. Here, the user specified span does not "reach into" the high band. The intermediate span and/or stitched band combinations can include Low or Low+Mid. It will be understood that when the user specified span falls entirely within a single frequency band, more than one frequency band can be used, but need not be used.

Figure 6:
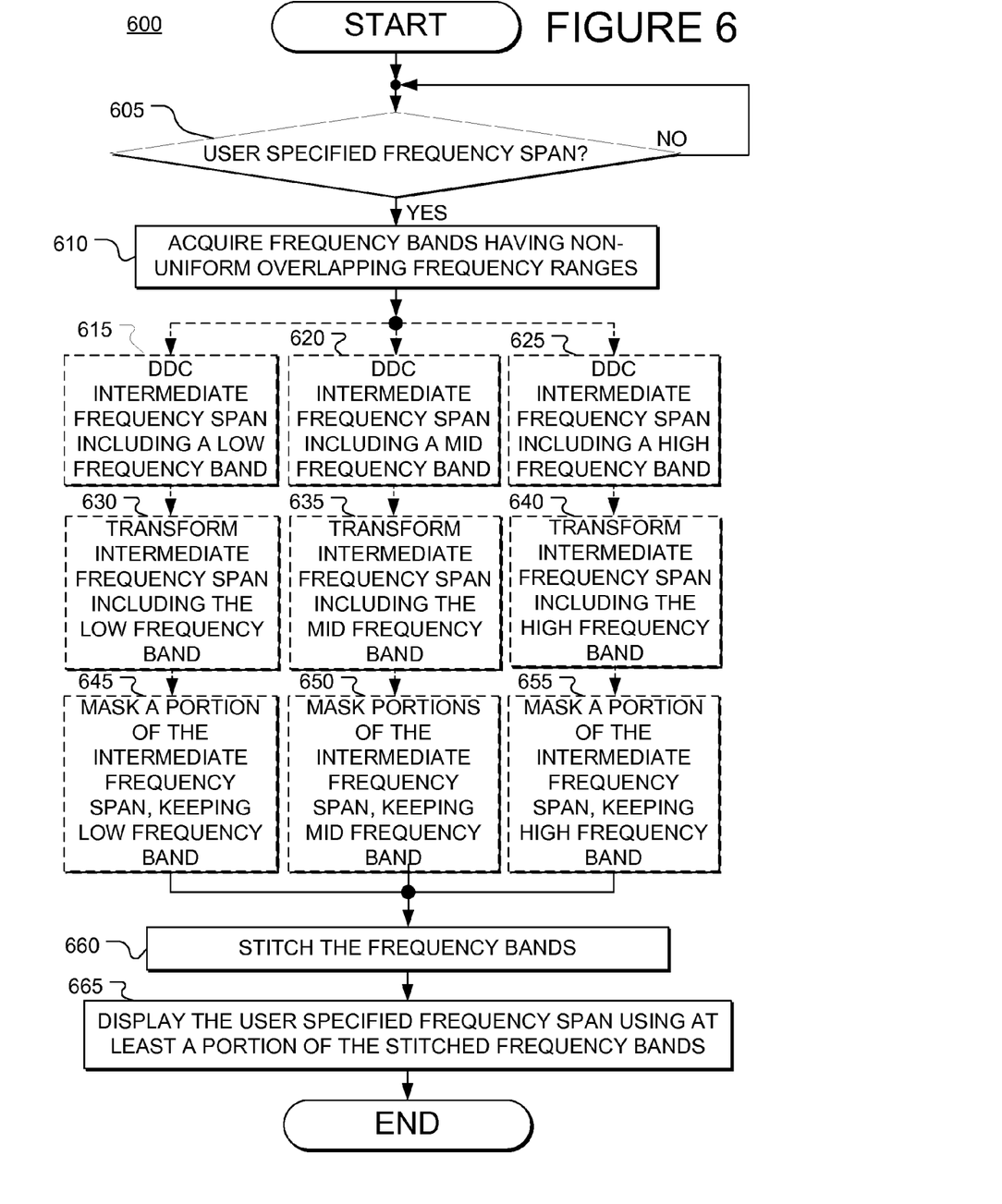
FIG. 6 illustrates a flow diagram demonstrating a technique for full spectrum stitching with wide overlapping bands according to another example embodiment of the invention.

FIG. 6 illustrates a flow diagram 600 demonstrating a technique for spectrum stitching with wide overlapping bands according to another example embodiment of the invention. The technique begins at 605 where a determination is made whether a user specified frequency span is received from a user of the spectrum analyzer. If NO, the flow returns and waits for input. Otherwise, if YES, the flow proceeds to 610, where frequency bands having non-uniform overlapping frequency ranges are acquired, as described in detail above. The flow proceeds along one or more of three different paths.

The first path includes blocks 615, 630, and 645. At 615, digital down conversion is performed on the intermediate frequency span, which can include the low frequency band when it is determined that the user specified span, or the intermediate frequency span, should use the low frequency band. In other words, the DDC section processes the low frequency band as if the entire intermediate frequency span was present, as described in detail above. At 630, the intermediate frequency span, including the low frequency band, is transformed by the transform section, as also described in detail above. At 645, a portion of the frequency band is masked, thereby keeping the low frequency span, and discarding the masked portion.

Alternatively, or in addition to the first path, the second path includes blocks 620, 635, and 650. At 620, digital down conversion is performed on the intermediate frequency span, which can include the mid frequency band when it is determined that the user specified span, or the intermediate frequency span, should use the mid frequency band. In other words, the DDC section processes the mid frequency band as if the entire intermediate span was present, as described in detail above. At 635, the intermediate frequency span, including the mid frequency band, is transformed by the transform section, as also described in detail above. At 650, a lower portion and an upper portion of the frequency band is masked, thereby keeping the mid frequency span, and discarding the masked portions.

Alternatively, or in addition to the first path and the second path, the third path includes blocks 625, 640, and 655. At 625, digital down conversion is performed on the intermediate frequency span, which can include the high frequency band when it is determined that the user specified span, or the intermediate frequency span, should use the high frequency band. In other words, the DDC section processes the high frequency band as if the entire intermediate span was present, as described in detail above. At 640, the intermediate frequency span, including the high frequency band, is transformed by the transform section, as also described in detail above. At 655, a portion of the frequency band is masked, thereby keeping the high frequency span, and discarding the masked portion.

At 660, two or more of the low, mid, and high frequency bands are stitched together to provide a full spectrum, as also described above. At 665, the user specified frequency span is displayed on the display device using at least a portion of the stitched frequency bands. The user specified frequency span may span two or more different stitched portions of the full span, as also explained in detail above. It will be understood that the blocks and decision points of the flow diagram 600 need not occur in the order shown. For example, the user specified frequency span can be received through the user interface after the non-uniform overlapping frequency bands are acquired.

Although particular embodiments have been described, it will be appreciated that the principles of the invention are not limited to those embodiments. For example, spectrum analyzers and other similar MDO devices are periodically expanding in their performance. Different non-uniform bands can be used according to the performance characteristics and capabilities of the next generation test and measurement devices, without deviating from the inventive principals disclosed herein. The frequency ranges may be wider or narrower than specifically disclosed herein. The number of predefined frequency bands may be greater or fewer. The frequency ranges can overlap by varying amounts.

In some embodiments, an article drawn from the set of media including floppy disks, optical disks, fixed disks, volatile memory, non-volatile memory, random access memory, read-only memory, or flash memory, comprising a machine-accessible medium having associated non-transitory instructions that, when executed in a test and measurement device, results in a machine performing the steps of the various embodiments of the invention as disclosed herein. Other variations and modifications may be made without departing from the principles of the invention as set forth in the following claims.

What is claimed is:

1. A test and measurement instrument, comprising:
   an RF input terminal;
   an attenuator coupled to the RF input terminal and structured to receive one or more input signals under test;
   a low band filtered path, a mid band filtered path, and a high band filtered path, each of the filtered paths capable of being coupled to the attenuator;
   a switch coupled to the attenuator and structured to divert the one or more input signals to at least one of the low band filtered path, the mid band filtered path, and the high band filtered path, to produce a low frequency band, a mid frequency band, and a high frequency band, respectively; and
   a digital down converter including a digital mixer and a down sampler configured to decimate the low frequency band, the mid frequency band, and the high frequency band, wherein the digital down converter is configured to operate based on a full frequency span of a final frequency spectrum;
   wherein the low frequency band, the mid frequency band, and the high frequency band are of non-uniform overlapping frequency ranges.

2. The test and measurement instrument of claim 1, wherein at least one of the low frequency band, the mid frequency band, and the high frequency band correspond to a first portion of an intermediate frequency span.

3. The test and measurement instrument of claim 2, further comprising:
   a transform section configured to receive the low frequency band and transform the intermediate frequency span including the first portion corresponding to the low frequency band; and
   a mask section configured to mask a second portion of the intermediate frequency span so that the first portion of the intermediate frequency span corresponding to the low frequency band is configured to be valid and the second portion is configured to be discarded.

4. The test and measurement instrument of claim 2, further comprising:
   a transform section configured to receive the mid frequency band and transform the intermediate frequency span including the first portion corresponding to the mid frequency band; and
   a mask section configured to mask a second portion of the intermediate frequency span and a third portion of the intermediate frequency span so that the first portion of the intermediate frequency span corresponding to the mid frequency band is configured to be valid and the second and third portions are configured to be discarded.

5. The test and measurement instrument of claim 2, further comprising:
   a transform section configured to receive the high frequency band and transform the intermediate frequency span including the first portion corresponding to the high frequency band; and
   a mask section configured to mask a second portion of the intermediate frequency span so that the first portion of the intermediate frequency span corresponding to the high frequency band is configured to be valid and the second portion is configured to be discarded.

6. The test and measurement instrument of claim 2, wherein the digital mixer is configured to mix a digital local oscillator signal with the low frequency band and the down sampler is configured to down sample the intermediate frequency span including the first portion corresponding to the low frequency band; and the test and measurement instrument further comprises:
   a mask section configured to mask a second portion of the intermediate frequency span so that the first portion of the intermediate frequency span corresponding to the low frequency band is configured to be valid and the second portion is configured to be discarded.

7. The test and measurement instrument of claim 2, wherein the digital mixer is configured to mix a digital local oscillator signal with the mid frequency band and the down sampler is configured to down sample the intermediate frequency span including the first portion corresponding to the mid frequency band; and the test and measurement instrument further comprises:
a mask section configured to mask a second portion of the intermediate frequency span and a third portion of the intermediate frequency span so that the first portion of the intermediate frequency span corresponding to the mid frequency band is configured to be valid and the second and third portions are configured to be discarded.

8. The test and measurement instrument of claim 2, wherein the digital mixer is configured to mix a digital local oscillator signal with the high frequency band and the down sampler is configured to down sample the intermediate frequency span including the first portion corresponding to the high frequency band; and the test and measurement instrument further comprises:
a mask section configured to mask a second portion of the intermediate frequency span so that the first portion of the intermediate frequency span corresponding to the high frequency band is configured to be valid and the second portion is configured to be discarded.

9. The test and measurement instrument of claim 1, further comprising:
a stitcher configured to stitch at least one of the low, mid, and high frequency bands with at least another one of the low, mid, and high frequency bands.

10. The test and measurement instrument of claim 1, further comprising:
a user interface configured to receive a user specified frequency span;
acquisition circuitry configured to acquire at least two of the low, mid, and high frequency bands having non-uniform overlapping frequency ranges;
a frequency band processing section configured to decimate each of the acquired frequency bands, mask each of the acquired frequency bands, and stitch the masked frequency bands together; and
a display section configured to display the user specified frequency span using the stitched frequency bands.

11. The test and measurement instrument of claim 1, wherein the low frequency band includes a frequency range from about 50 kHz to about 3.8 GHz, the mid frequency band includes a frequency range from about 2.75 GHz to about 4.5 GHz, and the high frequency band includes a frequency range from about 3.5 GHz to about 6 GHz.

12. A method for processing wide overlapped frequency bands, the method comprising:
acquiring a plurality of frequency bands having non-uniform overlapping frequency ranges;
decimating via a digital down converter including a digital mixer and a down sampler each of the plurality of frequency bands based on the full frequency span of a final frequency spectrum;
masking each of the plurality of frequency bands;
displaying a user specified frequency span using at least a portion of the stitched frequency bands,
wherein acquiring the plurality of frequency bands includes acquiring two or more of a low frequency band, a mid frequency band, and a high frequency band; and
determining an intermediate frequency span based on the user specified frequency span, wherein determining includes selecting and combining two or more of the low frequency band, the mid frequency band, and the high frequency band.

13. The method of claim 12, wherein the stitched frequency bands include two or more of the low frequency band, the mid frequency band, and the high frequency band, and wherein displaying includes:
displaying the user specified frequency span using at least a portion of the low frequency band of the stitched frequency bands.

14. The method of claim 13, wherein displaying includes:
displaying the user specified frequency span using at least a portion of the mid frequency band and a portion of the high frequency band, of the stitched frequency bands.

15. The method of claim 12, wherein determining includes selecting the low frequency band and the mid frequency band.

16. The method of claim 12, wherein determining includes selecting the low frequency band and the high frequency band.

17. The method of claim 12, wherein determining includes selecting the mid frequency band and the high frequency band.

18. The method of claim 12, wherein determining includes selecting the low frequency band, the mid frequency band, and the high frequency band.

19. The method of claim 12, further comprising:
transforming the intermediate frequency span including a first portion corresponding to the low frequency band;
masking a second portion of the intermediate frequency span;
keeping the first portion of the intermediate frequency span corresponding to the low frequency band as valid; and
discarding the second portion.

20. The method of claim 12, further comprising:
transforming the intermediate frequency span including a first portion corresponding to the mid frequency band;
masking second and third portions of the intermediate frequency span;
keeping the first portion of the intermediate frequency span corresponding to the mid frequency band as valid; and
discarding the second and third portions.

21. The method of claim 12, further comprising:
transforming the intermediate frequency span including a first portion corresponding to the high frequency band;
masking a second portion of the intermediate frequency span;
keeping the first portion of the intermediate frequency span corresponding to the high frequency band as valid; and
discarding the second portion.

22. One or more tangible computer-readable media storing non-transitory computer-executable instructions that, when executed by a processor, operate to perform the method according to claim 12.

* * * * *